(12) United States Patent
Cruz-Albrecht et al.

(10) Patent No.: US 6,937,175 B1
(45) Date of Patent: Aug. 30, 2005

(54) AMPLIFIER LINEARIZATION USING DELTA-SIGMA PREDISTORTION

(75) Inventors: Jose M. Cruz-Albrecht, Oak Park, CA (US); Kenneth R. Elliott, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/830,736

(22) Filed: Apr. 21, 2004

(51) Int. Cl.$^7$ ............................................... H03M 3/00
(52) U.S. Cl. ...................... 341/143; 341/144; 341/145; 375/296
(58) Field of Search ........................ 341/143, 118, 120, 341/144, 145, 142; 375/296, 297; 330/149

(56) References Cited

U.S. PATENT DOCUMENTS

| | | | |
|---|---|---|---|
| 6,094,101 A | | 7/2000 | Sander et al. |
| 6,587,514 B1 | | 7/2003 | Wright et al. |
| 6,781,435 B1 | * | 8/2004 | Gupta et al. ................ 327/407 |
| 2003/0179831 A1 | * | 9/2003 | Gupta et al. ................ 375/296 |
| 2004/0151257 A1 | * | 8/2004 | Staszewski et al. ......... 375/296 |

OTHER PUBLICATIONS

S. Norsworthy, R. Schreier, and G. Temes, "Delta-Sigma Data Converters: Theory, Design and Simulation," pp. 1-43, IEEE Pres, New York, 1997 (ISBN 0-7803-1045-4), no month.

Kennington, Peter B., High-linearity RF amplifier design, pp. 351-361, Artech House, Norwood, MA, 2000 (ISBN 1-58053-143-1), no month.

Cripps, Steven C., Advanced techniques in RF power amplifier design, pp. 153-195, Artech House, Norwood, MA, 2002 (ISBN 1-58053-282-9), no month.

* cited by examiner

Primary Examiner—John B Nguyen
(74) Attorney, Agent, or Firm—Aagaard & Balzan, LLP

(57) ABSTRACT

In one embodiment of the present invention, an amplifier circuit is provided which includes a predistorter coupled to a power amplifier. An error detector is coupled to the signal input of the predistorter via a delay circuit and to the power amplifier output. The error detector output is coupled to a delta-sigma modulator and the output of the delta-sigma is coupled to the control input of the predistorter. The predistorter may be constructed to provide an output selected from a set of output characteristic curves, in response to a control signal at the control input. The control input of the predistorter may be a multi-bit discrete input, which may be a binary input, such as for example, a three bit binary input.

35 Claims, 8 Drawing Sheets

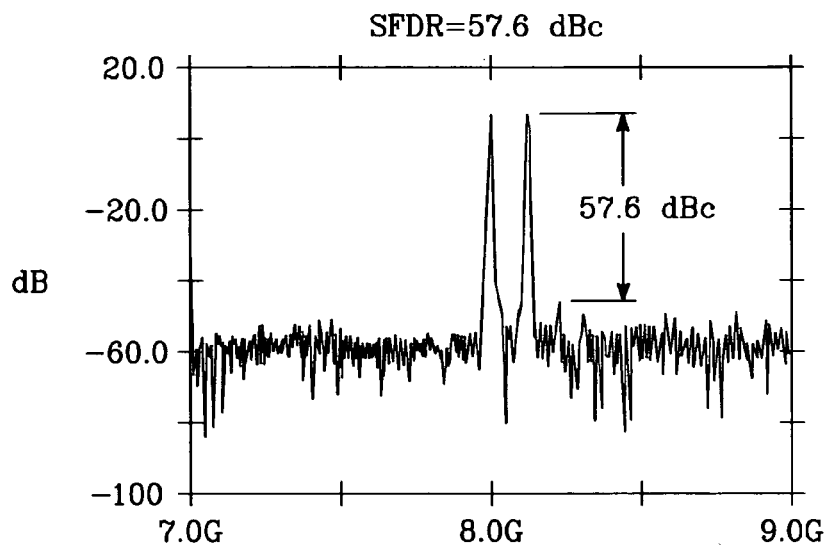
FIG. 11 DELTA-SIGMA PD+PA OUTPUT
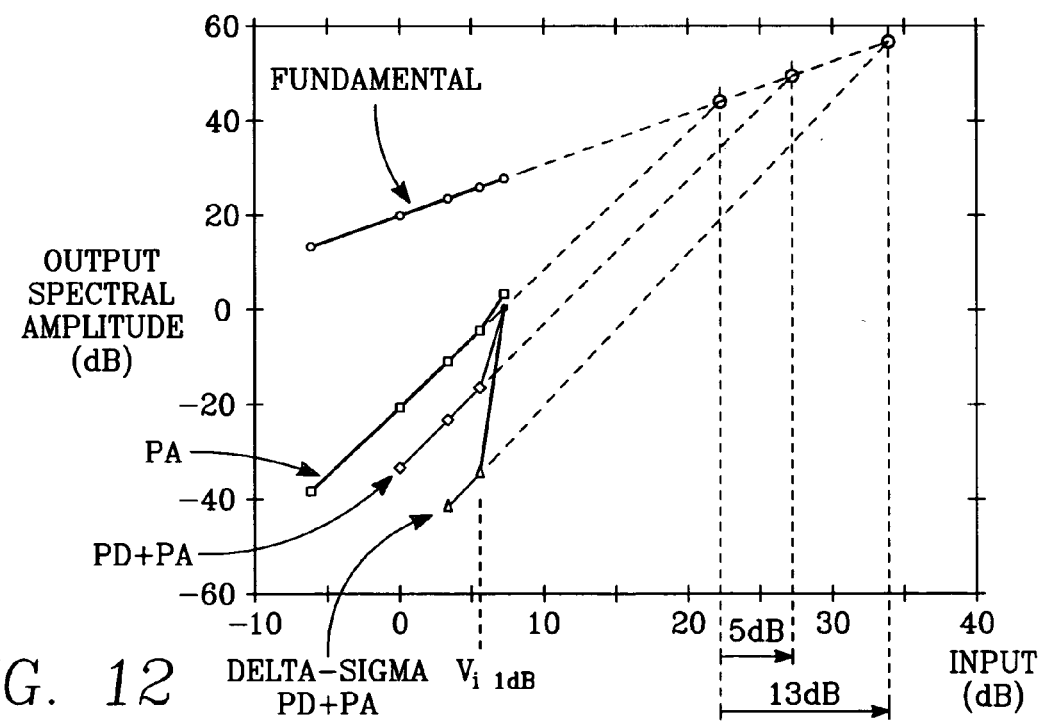
FIG. 12

AMPLIFIER LINEARIZATION USING DELTA-SIGMA PREDISTORTION

ORIGIN OF THE INVENTION

The U.S. Government has a paid-up license in this invention and the right in limited circumstances to require the patent owner to license others on reasonable terms as provided for the terms of contract number N00014-02-C-0209 awarded by The Office of Naval Research.

BACKGROUND

Amplifiers that have a linear input-output transfer curve are desirable in low distortion applications. In real practice, however, amplifiers have a nonlinear transfer curve. A typical transfer curve is one in which the slope of the curve diminishes for large input amplitudes. This produces gain compression, which results in distortion at the output of the amplifier. FIG. 1 shows a typical input-output transfer curve 12 of a power amplifier 10 illustrating gain compression. When an amplifier 10 with the characteristic of FIG. 1 is used to amplify a signal $V_i$, the output $V_o$ is distorted. For example, if the input $V_i$ is just a single-tone sinusoidal signal, that is, a signal with only one frequency component, $f_1$, the output $V_o$ instead will be a signal that will contain harmonics at integer multiples of the original input frequency. In a second example, if the input $V_i$ is a two-tone signal with just two close-by frequency components, $f_1$ and $f_2$. The output $V_o$ will be a signal that will contain harmonics and also intermodulation components, some of them will be close to the original frequencies $f_1$ and $f_2$. The distortion is determined by the height of the harmonic and intermodulation components. The distortion can be reduced by linearizing the amplifier 10.

Future power amplifier systems will require high bandwidth, high efficiency, and low harmonic content. Unfortunately, these goals are normally mutually exclusive. The presence of harmonics in amplifiers in real systems leads system designers to utilize constant envelope modulation, narrow bandwidth, and filtering to address individual system functions. In a wideband, RF multi-beam, multi-function system, the presence of multiple heterogeneous signals makes such an approach impractical. Backing-off on power levels is a commonly used but extremely inefficient method for improving linearity. Multi-beam, multi-function beams inevitably lead to nodes and anti-nodes in the signal that need to be faithfully reproduced to eliminate intermodulation products.

Methods for improving linearity include feed forward, feedback correction, and predistortion. Simple analog methods are subject to component mismatch and thermal drift, and commonly only address lower order harmonics of narrow band signals. The nonlinearity in the transfer curve 12 can be corrected by adding a predistorter amplifier 20 at the input of the amplifier 10, as shown in FIG. 2.

FIG. 2 shows the principle of predistortion. The predistorter amplifier 20 modifies the input signal $V_{pd}$ to cancel the nonlinearity of the output signal $V_o$ of the main amplifier 10. For example, if the main amplifier 10 exhibits gain compression for large amplitudes the predistorter 20 should exhibit gain expansion for larger input amplitudes. The predistorter 20 has a gain expansion as illustrated in transfer curve 25. Its output $V_{pd}$ is connected to the input of the power amplifier 10. If the gain expansion in the transfer curve 15 would be matched perfectly, then the input-output characteristic 35 of the predistorter and amplifier chain would be linear.

The predistorter 20 can be programable. It can have, for example, a control input (not shown) to adjust its gain expansion parameter, or other parameters. In those cases the predistorter 20 will be used in conjunction with a control circuit (not shown) that will try to set the gain expansion parameter to a value that best cancels the nonlinearity of the main amplifier 10.

In direct digital synthesis, predistortion is done digitally and converted to an analog input with a digital-to-analog converter. In this case, the gain expansion parameter, or other parameters, can be varied only among a finite set of digital values.

A finite set of values of the adjustment parameters, however, limits the distortion correction. Distortion correction is strongly dependent on how close the gain expansion parameter matches an optimal value. At any given time, though, none of the discrete values of the set will exactly coincide with the optimal predistortion value needed. This optimal value most probably will fall in between a pair of values of the set. One value of the pair will under-correct the compression, while the other will over-correct the compression. Hence, either of these two values, may still result in significant uncorrected distortion. Thus, the distortion improvement is limited when there are only a limited number of predistortion values and the optimum value falls in between two values of the set. Although it is possible to increase the number of values, this approach increases the complexity and cost of the system. In some applications, the number of predistortion values should be as small as possible to minimize the size and power of the predistorter circuit while achieving high data and control bandwidth.

Conventional predistortion is an effective method for improving linearity, but requires accurate a priori prediction of the distortion occurring in the power amplifier. Typical adaptive predistortion requires detailed estimation and correction of the distorted transfer curve of the system and is limited by the correction bandwidth of the estimation loop. An example is shown in U.S. Pat. No. 6,587,514, by Wright et al., herein incorporated by reference in its entirety, which uses digital compensation signal processing in the estimation loop. This limits the correction bandwidth. In addition, it utilizes a large look-up table. This increases complexity, and can limit the speed of operation. What is needed is a circuit that does not require digital signal processing in the feedback loop. In addition, what is needed is a less complex circuit that does not require a large look-up table and excessive memory storage requirements for operation.

SUMMARY

In one embodiment of the present invention, an amplifier circuit is provided which includes a predistorter coupled to a power amplifier. An error detector is coupled to the signal input of the predistorter via a delay circuit and to the power amplifier output. The error detector output is coupled to a delta-sigma modulator and the output of the delta-sigma modulator is coupled to the control input of the predistorter. The predistorter may be constructed to provide an output selected from a set of output characteristic curves, in response to a control signal at the control input. The control input of the predistorter may be a multi-bit discrete input, which may be a binary input, such as for example, a three bit binary input.

BRIEF DESCRIPTION OF THE DRAWINGS

The features and advantages of the present invention will be better understood with regard to the following description, appended claims, and accompanying drawings where:

FIG. 11 shows the output spectrum of a simulation example of the power amplifier of FIG. 9 with delta-sigma modulated predistortion in accordance with the amplifier circuit of FIG. 3.

FIG. 12 shows is a plot of fundamental and third order intermodulation verses input amplitude for the examples of FIGS. 9–11.

DESCRIPTION

Figure 1:
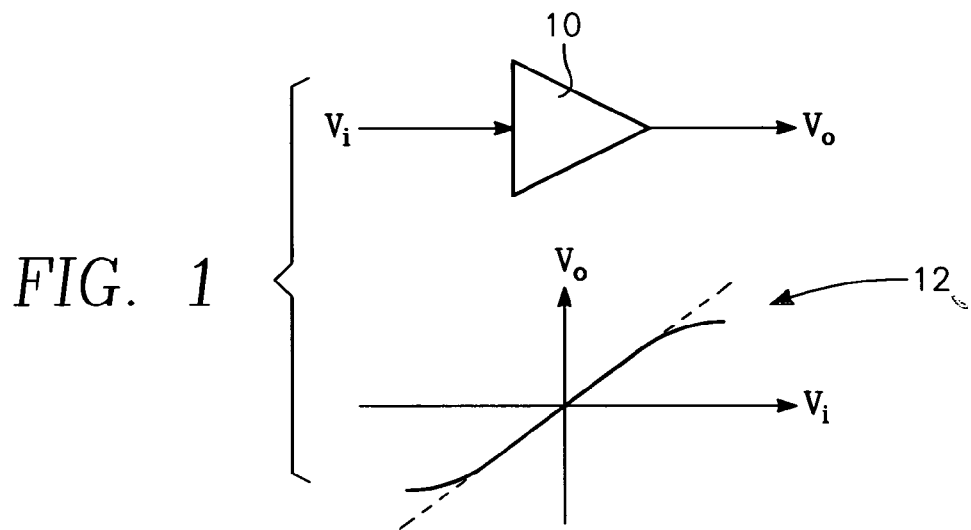
FIG. 1 shows a typical input-output transfer curve of a prior art power amplifier illustrating gain compression.
Figure 2:
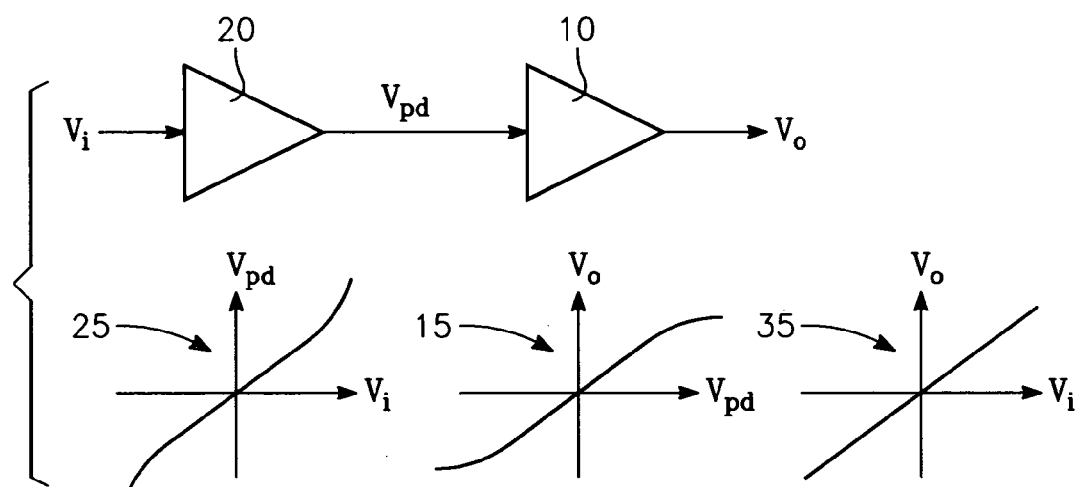
FIG. 2 shows the prior art principle of predistortion.
Figure 3:
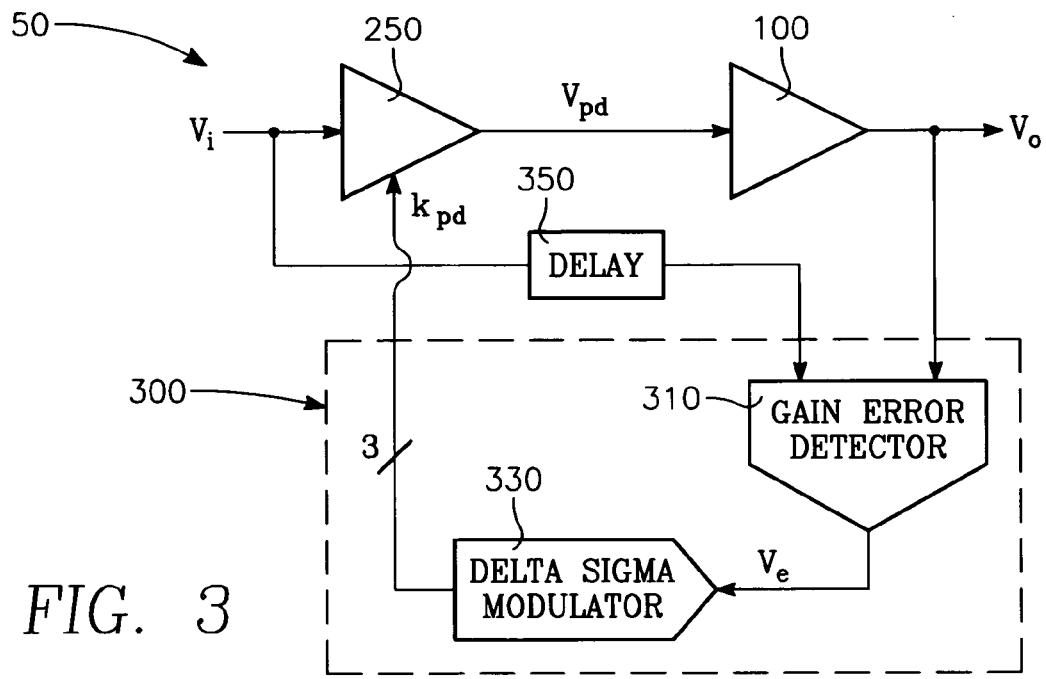
FIG. 3 shows an amplifier circuit having an analog predistorter with a delta-sigma modulator.

FIG. 3 shows a diagram of a possible amplifier linearization circuit 50 in accordance with the present invention. The adaptive predistortion is provided in which the transfer characteristic of a predistorter 250 is controlled by a control circuit 300. The control circuit 300 sets the gain expansion parameter of the predistorter 250. The control circuit 300 includes gain error detector 310 which has inputs coupled to the input $V_i$ of the predistorter 250 and to the output $V_o$ of the amplifier 100. A delta-sigma modulator 330 is coupled to an output of the gain error detector 310. The output of the delta-sigma modulator 330 is coupled to the predistorter 250. The delta-sigma modulator 330 generates a multi-bit control signal based on the output of the gain error detector 310.

Figure 4A:
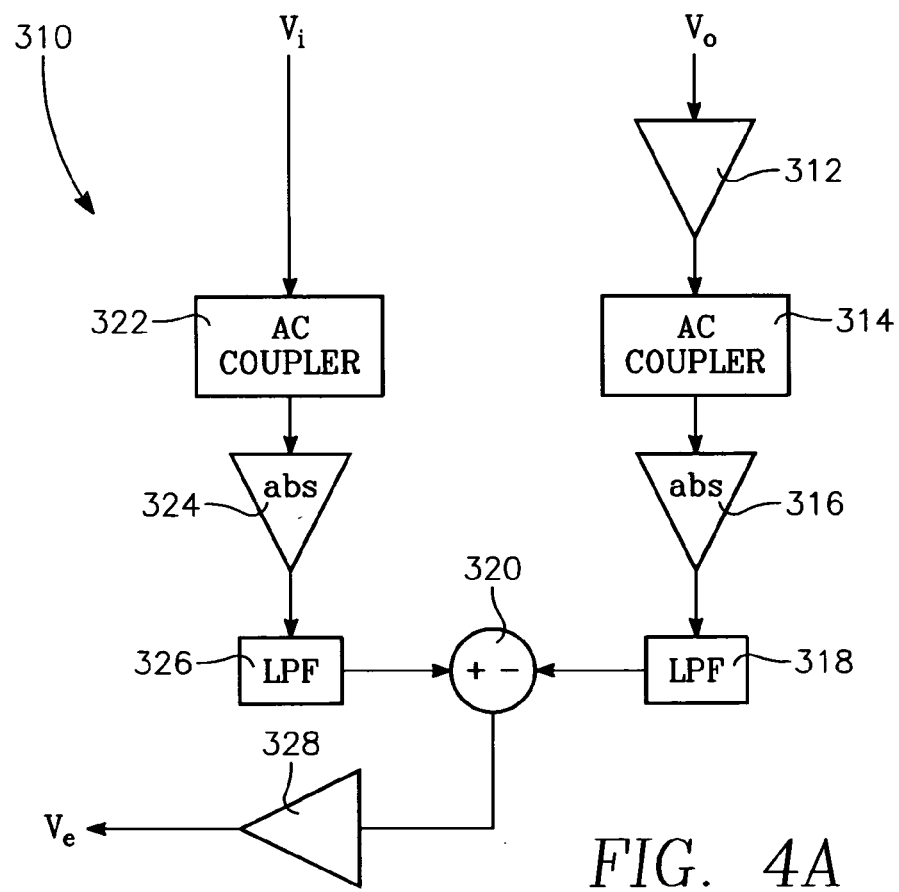
FIG. 4A shows a block diagram of a possible embodiment of an error detector.

FIG. 4A shows a block diagram of a possible example embodiment of the gain error detector 310. This circuit has two inputs: $V_i$ and $V_o$. The input signal $V_i$, is the input of the predistorter 250. The input signal $V_o$ is the output of the main amplifier 100. The gain error detector 310 of FIG. 4A detects whether the average gain of the circuit for the latest cycles is larger than or is smaller than the nominal linear value. The gain error detector compares the output $V_o$ of the amplifier 100 with the input $V_i$ of the predistorter 250 and generates and error signal indicating amount of distortion in the output signal $V_o$.

One input of the gain error detector 310 includes an attenuator 312 which is coupled to the output of the amplifier 100. The signal $V_o$ is AC fed into the attenuator 312. This attenuator 312 has a gain equal to 1/A, where A is the nominal gain of the main amplifier 100. A typical value for A is 10. The attenuator 312 is coupled to an absolute value circuit 316 via an AC coupler 314. The output of the absolute value circuit 316 is coupled to an LPF or low pass filter 318, which is coupled to a subtractor 320. Thus, the normalized signal $V_o/A$ is fed into the absolute value circuit 316 (via the AC coupler 314) and then to the low pass filter 318. The AC coupler 314 removes any DC offset in the signal, and the absolute value circuit 316 provides a single sided output. The output of the low pass filter 318 provides the latest average normalized output amplitude.

At the other input of the gain error detector 310, an AC coupler 322 is coupled to the input of the predistorter 250 so that the input signal $V_i$ is AC fed to an absolute value circuit 324. The absolute value circuit 324 is coupled to a low pass filter 326, which is coupled to the subtractor 320. The output of the low pass filter 326 gives a measure of the latest average of the input amplitude.

The subtractor 320 subtracts the outputs from the low pass filters 318 and 326 to provide an error signal. The error signal is positive when the average amplitude of the input signal is larger than the output divided by the nominal gain, when there is gain compression in the predistorter plus amplifier combination. The error signal is negative when there is gain expansion in the predistorter plus amplifier combination. In one example embodiment, this error signal is provided to an optional loop amplifier 328 and amplified by a factor of 20. This amplification increases the sensitivity of the feedback correction loop of the delta-sigma modulator. The amplified error signal $V_e$ may be supplied to the delta-sigma modulator 330.

Figure 4B:
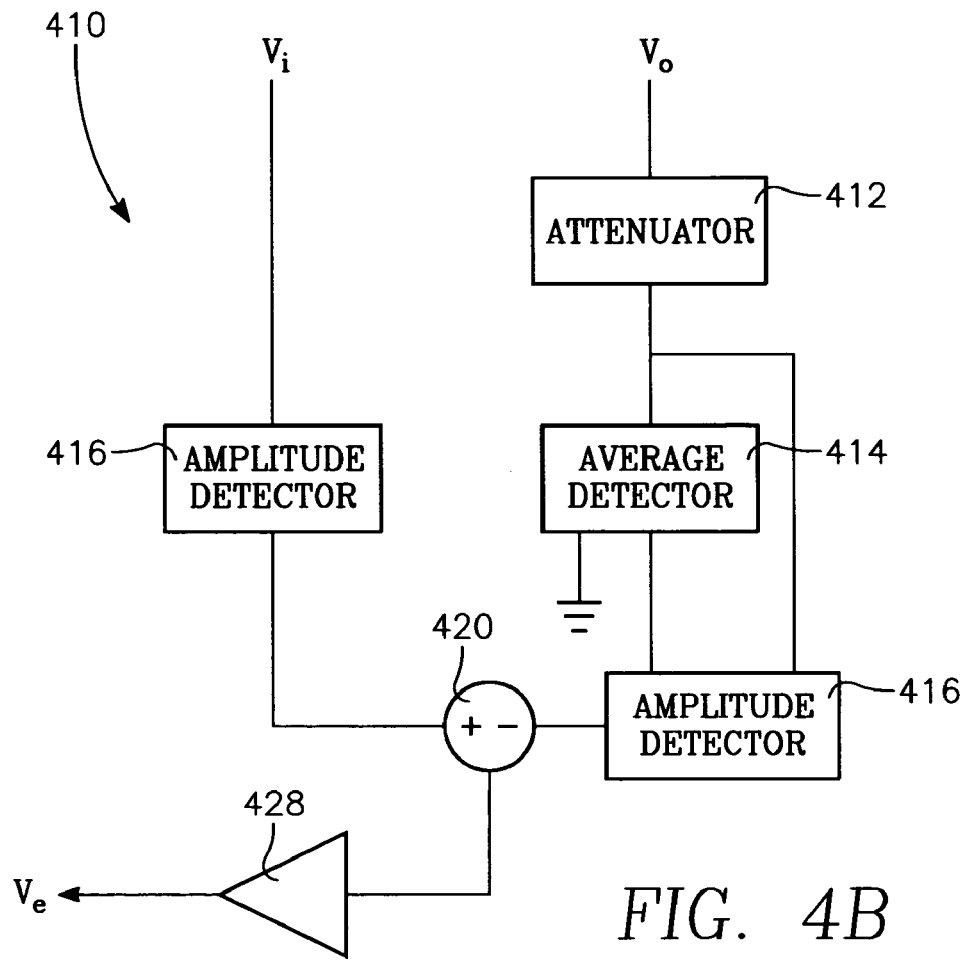
FIG. 4B illustrates a possible alternate embodiment of an error detector.

FIG. 4B illustrates a possible alternate embodiment of an error detector 410 capable of use when the signal $V_i$ has no DC offset. In this embodiment, the amplifier 100 output signal $V_o$ is supplied to an attenuator 412. The attenuator 412 is coupled to an average detector 414 and to the positive terminal of a differential amplitude detector 416. The output of the average detector 414 is coupled to the negative terminal of the amplitude detector 416. The output of the amplitude detector is supplied to the subtractor 420. The input signal $V_i$ is supplied to an amplitude detector 416. The amplitude detector 416 is coupled to the subtractor 420. The subtractor 420 provides an error signal which may be amplified by amplifier 428 to provide the error signal $V_e$.

Figure 5:
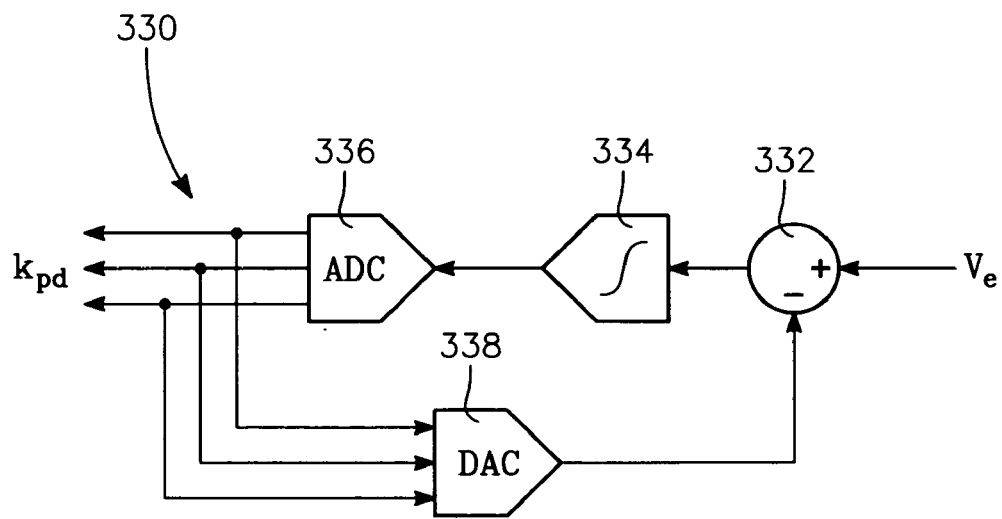
FIG. 5 shows an example embodiment of a delta-sigma modulator.

FIG. 5 shows an example embodiment of a 3-bit delta-sigma lowpass modulator 330. The input of the modulator 330 is the error signal $V_e$. The error signal $V_e$ is supplied to one input of a subtractor 332. The output of a subtractor 332 is coupled to an ADC or analog-to-digital converter 336 via an integrator 334. The output of the ADC provides the signal $k_{pd}$ which is coupled to a DAC or digital-to-analog converter 338 and to the predistorter 250 (not shown in FIG. 5). The output of the DAC 338 is coupled to an input of the subtractor 332.

The output of the delta-sigma modulator 330 is a multi-bit signal, $k_{pd}$, such as for example a 3-bit signal that can have 8 possible values, ranging from 000 to 111. The value $k_{pd}=100$ sets the predistorter to have no gain expansion. Increasing values of $k_{pd}$ increase the gain expansion of the predistorter. Values of $k_{pd}$ around the center of the range ("011" and "100") set the predistorter 250 to compensate for typical gain compression in the amplifier under normal conditions. The value $k_{pd}$=111 sets the predistorter 250 to the maximum expansion, which should be designed to be able to compensate the worst case of gain compression in the main amplifier.

The value of the $V_e$ controls the average value of $k_{pd}$. The signal $k_{pd}$, however, is not constant, but will switch among the allowed discrete values while keeping the average set by $V_e$. For example, if the amount of gain expansion needed is in between $k_{pd}$=011 and $k_{pd}$=100 the delta-sigma loop will alternate the actual $k_{pd}$ among these values.

The multi-bit signal $k_{pd}$ is a discrete signal, such as for example a 3-bit binary signal, as illustrated in FIGS. 3 & 5. Depending on the particular implementation, the multi-bit signal to the predistorter 250 may have any number of bits, such as for example 2, 4, 5, 6, 7, 8, or more, and/or may be a multi-level non-binary discrete signal, if desired.

In the embodiment of FIG. 3, the control circuit 300 is an adjustment loop that continuously measures gain error at the output of the amplifier 100, then generates an analog error signal $V_e$ that is used to set the average value of the gain expansion for the predistorter 250. This average value is analog and can take any intermediate value. The delta-sigma modulator loop is used inside the adjustment loop to convert this average value into the actual instantaneous discrete value $k_{pd}$ of predistortion fed into the predistorter 250. The instantaneous predistortion value $k_{pd}$ fed to the predistorter 250 is discrete. Its value switches among the discrete values of the finite set, while at the same time maintaining the optimum average. This can occur even for a steady input, the predistorter value will switch over time, with its average value being optimized by the control circuit 300 loop.

In typical operation the instantaneous predistortion expansion value automatically alternates between the two discrete values closest to the optimum: one that undercorrects the compression and one that overcorrects the compression. The control circuit 300 generates a stream of time dependent $k_{pd}$ values to minimize the distortion at the output of the amplifier 100. Even when the amplifier 100 is under steady conditions, the $k_{pd}$ is not fixed. Instead of selecting a single $k_{pd}$ value that best cancels the non-linearity of the amplifier 100, the goal is to select a time changing combination of values that result in lower distortion.

The example embodiments of FIGS. 3–5 compensate any over correction or under correction over time. The input signal $V_i$ is amplified, then the gain error detector 310 compares the input $V_i$ and output $V_o$. The control circuit loop 300 continuously averages the last few periods to detect whether predistorter 250 is overcorrecting or undercorrecting. The delta-sigma modulator 330 then provides a discrete multi-bit signal to the predistorter 250 for selecting the proper predistortion curve. In the example embodiments of FIGS. 3–5, the 3-bit signal provides a signal-to-noise ratio comparable to 12 bits resolution over the bandwidth of the low pass filter 318. The predistorter signal $k_{pd}$ is being modulated between discrete values to provide an average output with high resolution. For example, if the analog equivalent of multi-bit signal $k_{pd}$ switches between 300 mV and 400 mV, but is more often at 400 mV, the average may be 375 mV. It actually switches between two discrete values in a controlled manner so that if the correct average value is closer to 400 mV it would be more often at 400 mV than at 300 mV.

The average $k_{pd}$ over time corresponds to the proper correction for the predistorter 250. So, in certain embodiments, an interpolative filter, or a decimator filter is not required as would be in a traditional A/D converter. Thus, in some embodiments, the delta-sigma modulator 330 provides a very high frequency signal with a low number of bits to the predistorter 250.

The predistorter 250 with delta-sigma modulator 330 control allows improved performance. In some embodiments, it allows increased linearity for a given amplitude. Alternatively, it allows increased amplitude for a given linearity to provide higher amplifier efficiency. As such, in some implementations it can improve linearity without increasing the power.

In some embodiments, the predistorter 250 with delta-sigma modulation significantly reduces the harmonic distortion and/or the intermodulation distortion of the predistorter 250 and amplifier 100 combination. Multi-tone signals can generate intermodulation components that are often closer to the center frequencies than harmonic frequencies. While harmonic frequencies can be more easily filtered typically, intermodulation components are not always so easily filtered. In some embodiments with multi-tone signals, however, significant improvement of the Spur-Free Dynamic Range or SFDR is possible. Thus, the intermodulation components may be reduced, or even eliminated, thereby significantly improving the SFDR.

Furthermore, in certain embodiments, distortion may be reduced without increasing the complexity of the predistorter 250. Because predistorter size and complexity depends on the number of available predistortion values, in some embodiments it is desirable to reduce distortion without increasing this number of possible predistortion values. Switching between the closest values can reduce the distortion of the amplifier 100 without having to increase the number of possible predistortion values. Thus, certain embodiments provide improved linearity while using a simpler predistorter 250. Further, in some implementations, predistortion adjustment is provided which allows compact design and does not require high precision components. As such, some embodiments are well suited for compact IC implementation.

Adaptive predistortion with delta-sigma modulation allows a time domain correction which tends to noise shape and spread the spectrum of the errors to provide a spectrally more pure signal. Moreover, delta-sigma modulation of the predistorter 250 allows decoupling of the control circuit 300 loop bandwidth from the data bandwidth. Further, a multi-bit delta-sigma modulator 330 allows wider bandwidth for the control circuit 300 loop.

In some embodiments, high speed mixed signal InP heterogeneous bipolar transistor technology is an ideal technology for the implementation of adaptive pre-distortion because of the possibility of extremely low latency in the control circuit 300 loop. As a result, control circuit 300 loop bandwidths greater than 1 GHz are feasible, permitting real time correction of short term thermal and trapping induced drift in the amplifier 250. Also, the adaptive correction is a second order effect and typically represents a small time dependent, non-periodic change to the predistorter signal. The net effect is that the signal and control bandwidths are decoupled permitting high bandwidth, good efficiency, and low harmonic content simultaneously.

FIGS. 3–5 are for illustration purposes. It is possible to have various embodiments of the present invention. For example, it is possible to use a first, a second, or a third order delta-sigma modulator. Furthermore, certain embodiments may be implemented in continuous time and/or in discrete time. For example, the integrator 334 could be implemented in continuous time (such as by using a capacitor to implement the integrator 334), or in discrete time. The integrator 334 can also be replaced by a higher order low pass or bandpass filter, such as for example a second order filter.

Some embodiments of the invention may be implemented with an all analog predistorter 250. In such a case, a multi-level discrete level analog signal is provided by the delta-sigma modulator 330 of FIG. 5. Instead of the output $k_{pd}$ of the delta-sigma modulator 330 being provided by the ADC 336, it is provided by the DAC 338. In such an embodiment, the DAC 338 provides a single analog signal with discrete levels to drive an analog predistorter 250. Thus, the output of an analog predistorter 250 may be selected using the DAC 338 to provide the control signal $k_{pd}$.

Figure 6:
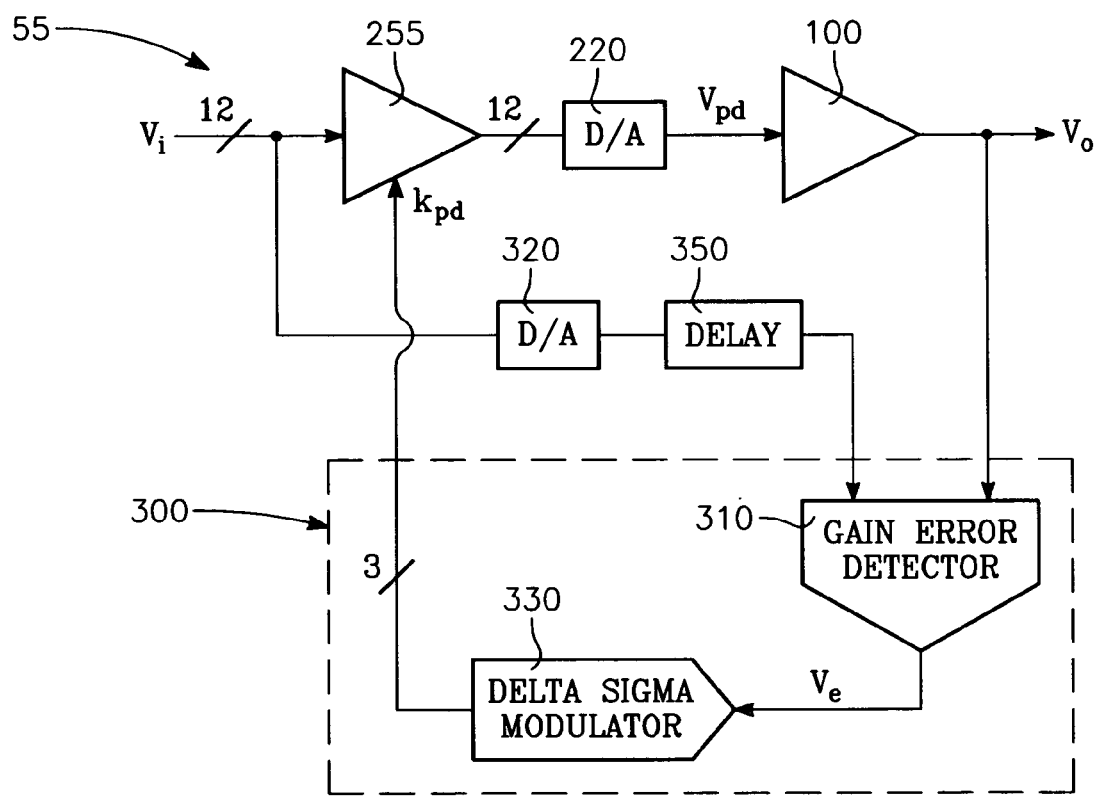
FIG. 6 shows an amplifier circuit having a digital predistorter with a delta-sigma modulator.

FIG. 6 shows a diagram of another possible amplifier linearization circuit 55 in accordance with the present invention. The adaptive predistortion of a digital input signal is provided by a digital predistorter 255. The digital predistorter output is provided to the amplifier 100 via a digital-to-analog converter 220. The transfer characteristic of a digital predistorter 255 is controlled by a control circuit 300. The control circuit 300 sets the gain expansion parameter of the digital predistorter 255. The control circuit 300 includes gain error detector 310. One input of the gain error detector 310 is coupled to the input $V_i$ of the digital predistorter 255 via a D/A converter 320 and a delay circuit 350. The other input of the gain error detector 310 is coupled to the output $V_o$ of the amplifier 100. A delta-sigma modulator 330 is coupled to an output of the gain error detector 310. The output of the delta-sigma modulator 330 is coupled to the digital predistorter 255. The delta-sigma modulator 330 generates a multi-bit control signal based on the output of the gain error detector 310.

In some embodiments, the gain error detector 310 may be constructed to couple to one or more digital signals. In such an embodiment the D/A converter 320 may be incorporated into the gain error detector. Or, the gain error detector may be constructed to compare digital signals so instead may include an A/D converter.

Figure 7:
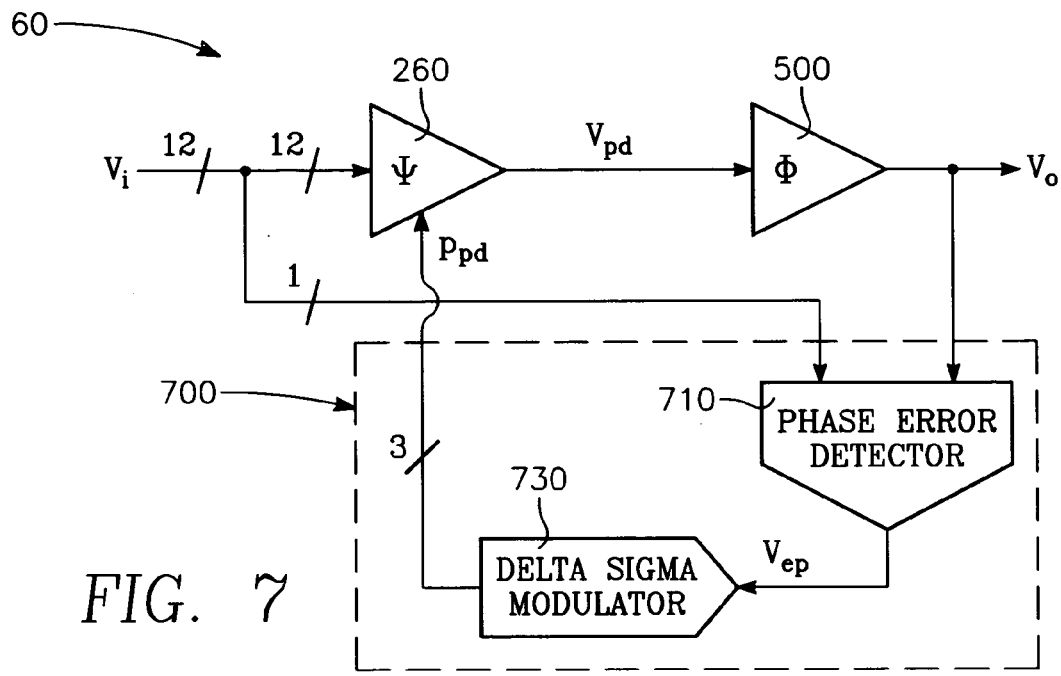
FIG. 7 illustrates a phase correction circuit including a delta-sigma modulator.

FIG. 7 shows a diagram of a phase correction circuit 60 in accordance with the present invention. If the output waveform $V_o$ and the input waveform $V_i$ of the power amplifier 500 differ in phase, such as when the phase change is a function of the input voltage $V_i$, or when the phase error changes depending on the operating conditions of the power amplifier, adaptive phase correction may be desirable. In the embodiment of FIG. 7, the input signal $V_i$ is supplied to a phase predistorter 260. The input signal $V_i$ may be for example, a 12 bit digital signal as illustrated in FIG. 7. The output of the phase predistorter $V_{pd}$ is coupled to an amplifier 500 to provide an output $V_o$. In the phase correction loop 700, the input $V_i$ and the output $V_o$ are coupled to the phase error detector 710. The phase error detector 710 is coupled to a delta-sigma modulator 730 and provides a phase error signal $V_{ep}$ to the delta-sigma modulator 730. The delta-sigma modulator provides a control signal $P_{pd}$ to set the value of the phase error provided by the phase predistorter 260. The control signal $P_{pd}$ may be for example a 3-bit discrete digital signal as illustrated in FIG. 7.

Figure 8:
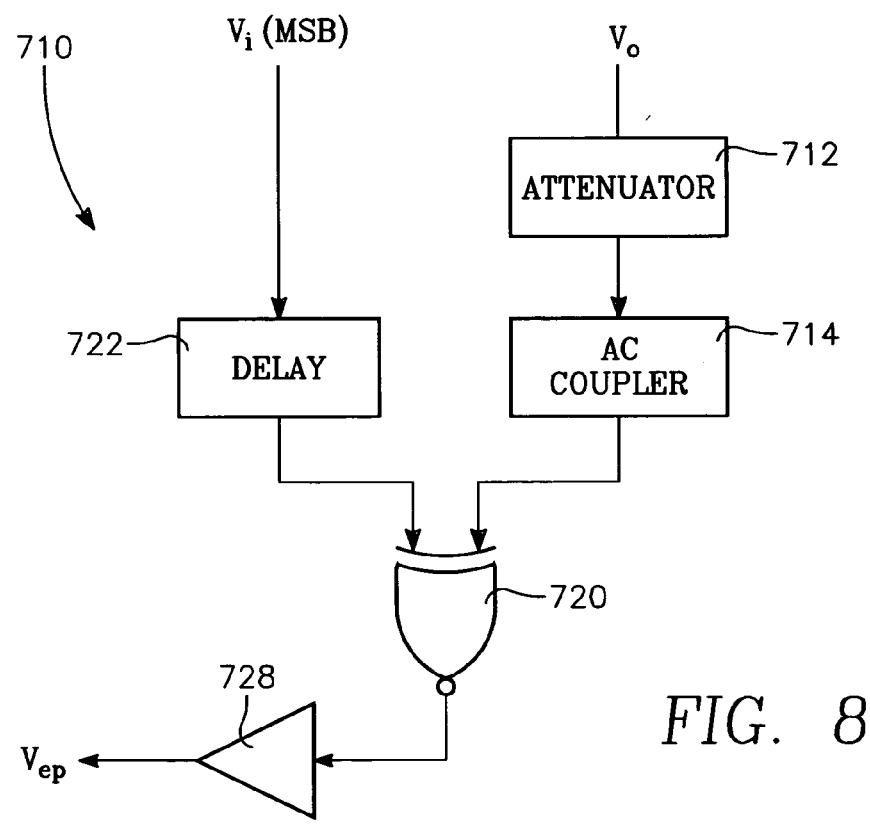
FIG. 8 shows a possible embodiment of a phase detector for use in the phase correction circuit of FIG. 7.

FIG. 8 shows a possible embodiment of the phase detector 710. The output $V_o$ is provided to an attenuator 712. The attenuator is coupled to an a exclusive nor gate 720 via an AC coupler 714. The input signal $V_i$ is supplied to a delay circuit 722. In the embodiment shown in FIGS. 7 & 8, only the most significant bit is provided to the phase error detector 710. The delay circuit 722 is coupled to the exclusive nor gate 720. The output of the exclusive nor gate 720 may be coupled to an integrator-amplifier 728. The integrator-amplifier circuit 728 supplies the phase error signal $V_{ep}$ to the delta-sigma modulator 730 (shown in FIG. 7).

The phase correction circuit 60 may be combined with the amplifier linearization circuit 50 to provide both gain and phase correction for an amplifier circuit.

EXAMPLE RESULTS

FIGS. 9–14

Figure 9:
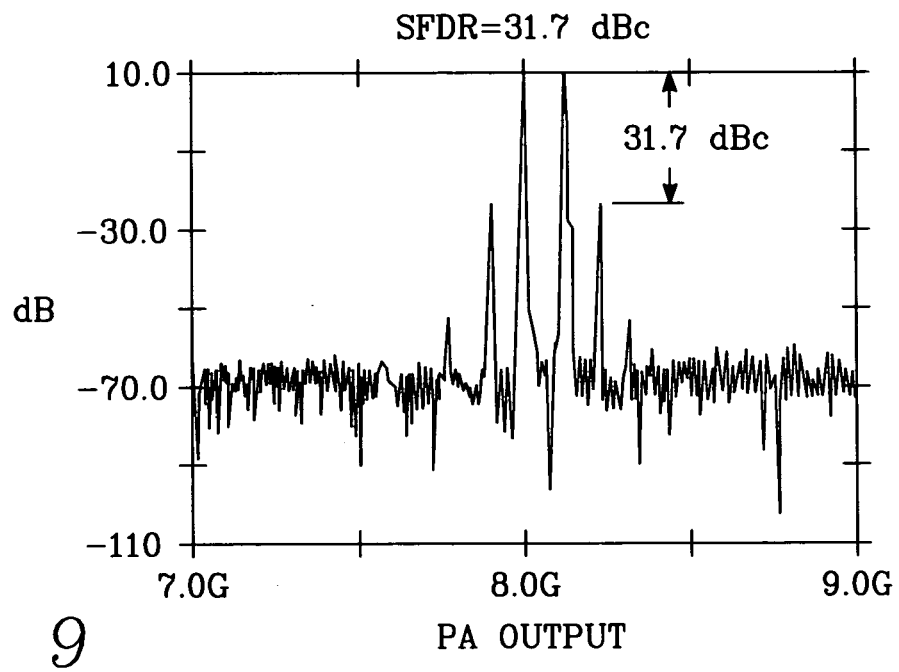
FIG. 9 shows the output spectrum of a simulation example of a power amplifier operation without predistortion resulting from a two tone input signal of $f_1=8.0$ GHz and $f_2=8.1$ GHz.

FIG. 9 shows the output spectrum of a simulation example of a power amplifier operation, with a two tone input signal of $f_1$=8.0 GHz and $f_2$=8.1 GHz, each tone having an amplitude of 1V. This example corresponds to the power amplifier operating in class AB. This result is obtained by a simulation in the time-domain and then performing a fast Fourier transform on the final signal. Third order intermodulation products with frequencies 7.9 GHz and 8.2 GHz are shown.

In FIG. 9, simulation of the power amplifier model shows intermodulation products obtained as the power amplifier is driven into compression. The magnitude of the intermodulation distortion is about −31.7 dBc. This value of distortion is dependent on the amplitude of the input signal. Reducing the input amplitude will reduce the distortion, but will degrade the power efficiency of the power amplifier. Increasing the input amplitude will improve the power efficiency, but will further degrade the distortion. An improvement of roughly 20 dB is needed to provide a desirable level of distortion for some implementations.

Figure 10:
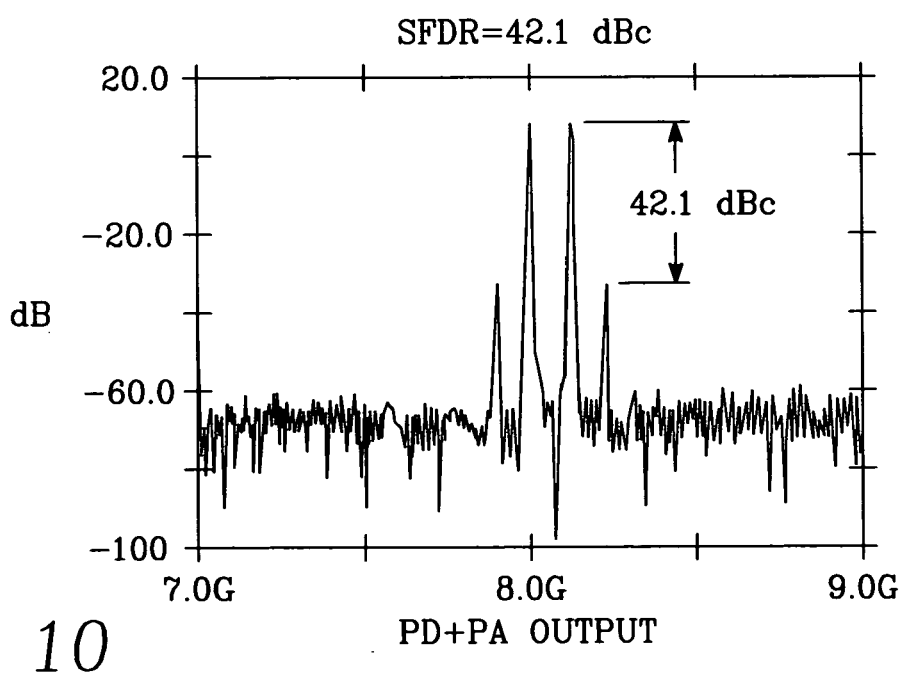
FIG. 10 shows the output spectrum of a simulation example of the power amplifier of FIG. 9 with static predistortion.

FIG. 10 illustrates the output spectrum of a simulation example of the power amplifier of FIG. 9 with a predistorter. As in the example of FIG. 9, a two tone input signal is provided with $f_1$=8.0 GHz and $f_{2=8.1}$ GHz, each tone having an amplitude of 1V. In FIG. 10 the predistorter has a fixed predistortion value. As shown in FIG. 10, the SFDR has improved by about 10 dB compared to the simulation of FIG. 9. Although linearity is improved, as kpd is discrete, even the best steady value selected by the adaptive control will result either in some amount of under-correction or over-correction of the power amplifier non-linearity.

FIG. 11 illustrates the output spectrum of a simulation example of the power amplifier and predistorter of FIG. 10 with a delta-sigma modulator as shown in FIG. 3. As in the example of FIG. 10, a two tone input signal is provided with $f_1$=8.0 GHz and $f_2$=8.1 GHz, each tone having an amplitude of 1V. In FIG. 11 the intermodulation components are barely visible over the noise floor. The SFDR has improved to about 57.6 dBc. In this example, the SFDR has improved about 26 dB over the simulation results of FIG. 9, and about 16 dB over the simulation results of FIG. 10.

The benefits of the using the delta-sigma modulator in the feedback configuration is manifold. One benefit is that the delta-sigma modulators can have very high dynamic range that improves as the bandwidth is reduced. The net result is that in the low frequency limit, the predistortion coefficient is extremely accurate.

In one implementation, a multi-bit InP-based heterogeneous bipolar transistor delta-sigma configuration can provide excellent control bandwidth in the GHz range, enabling correction bandwidths beyond what is achievable using conventional Si-DSP correction.

Turning to FIG. 12, shown is a plot of fundamental and third order intermodulation verses input amplitude for the examples of FIGS. 9–11. As with FIGS. 9–11, the results are for a two tone signal with $f_1$=8.0 GHz and $f_2$=8.1 GHz. The vertical axis shows the spectral amplitude of the output signal fundamental component and the third order intermodualtion component IM3. The third order Intercept Point IP3 is shown graphically in FIG. 12. The PA line represents the power amplifier only example of FIG. 9. The PD+PA line represents the power amplifier and predistorter of FIG. 10. The Delta-Sigma PD+PA represents the power amplifier and predistorter with delta-sigma modulation of FIG. 11.

Figure 13:
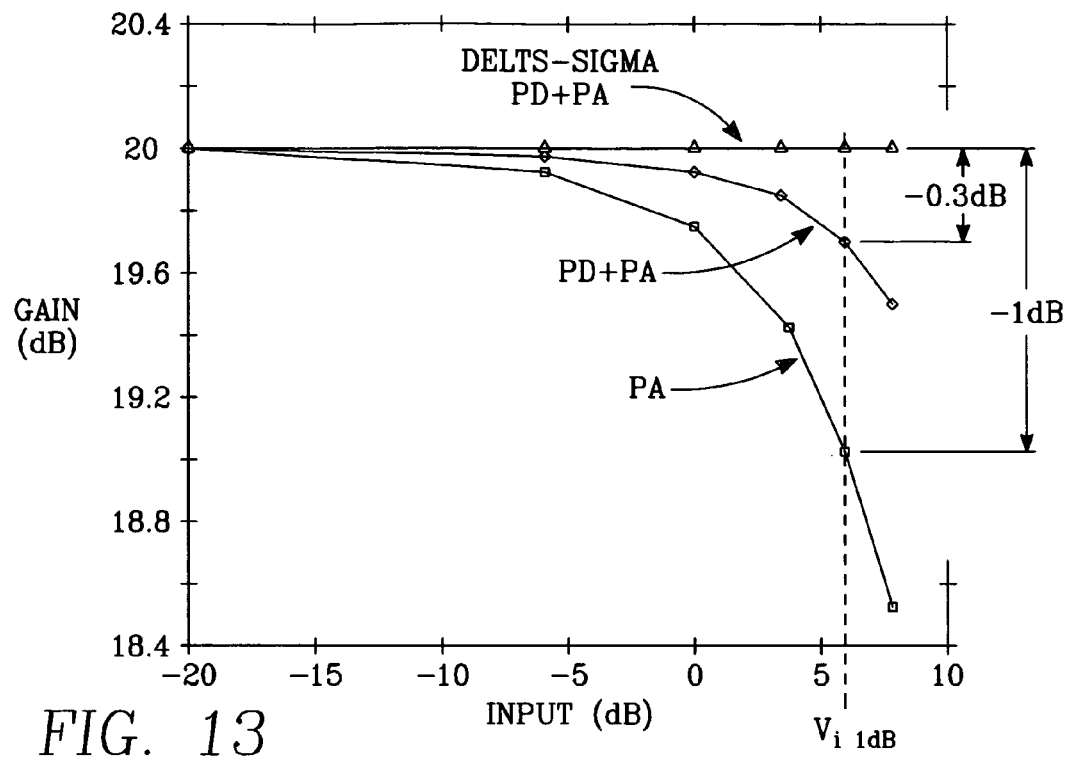
FIG. 13 shows a plot of gain verses input amplitude for the examples illustrated in FIGS. 9–11.

FIG. 13 shows a plot of gain verses input amplitude for the examples illustrated in FIGS. 9–11. The data for FIG. 13 is calculated from FIG. 12 data by calculating the ration of the output fundamental amplitude to the input amplitude. Gain compression can be observed for both the power amplifier only circuit PA and the power amplifier with unmodulated predistortion PA+PD circuit as the input amplitude increases. For the power amplifier with delta-sigma modulation or Delta-Sigma PD+PA, gain compression is eliminated, even when the circuit is driven with input amplitudes as large as 2 dB over $v_{i1dB}$. The value $v_{i1dB}$ represents the input power level resulting in 1 dB compression in the original power amplifier PA.

Figure 14:
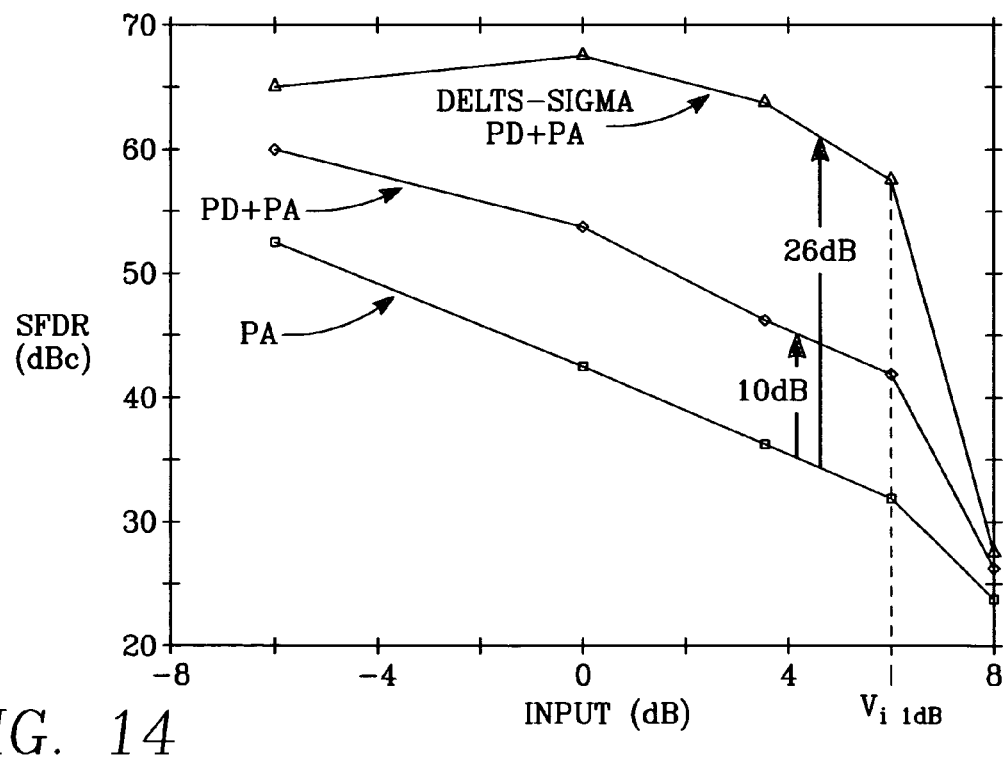
FIG. 14 shows the SFDR verses the input amplitude for the examples illustrated in FIGS. 9–11.

FIG. 14 shows the SFDR verses the input amplitude for the examples illustrated in FIGS. 9–11. The SFDR is the difference from a fundamental tone and the next highest spur (in most cases the highest spur is given by the IM3 shown in FIG. 12) for the output signal. This is done for different input amplitudes for a two-tone input signal. The SFDR curve for the power amplifier PA without predistortion is the lower curve shown on FIG. 14. The SFDR is limited by IM3. The SFDR curve for the power amplifier and unmodulated predistorter PD+PA shows an improvement of about 10 dB for input amplitudes up to $v_{i1dB}$. The SFDR curve for the power amplifier with delta-sigma predistortion or Delta-Sigma PD+PA is the upper curve, which has the highest values for the entire range of input amplitudes. The SFDR shows an improvement as large as 26 dB. This improvement remains constant up to input amplitudes as large as $v_{i1dB}$ (when the original power amplifier PA is driven up to 1 dB compression point). This improvement is a consequence of the large reduction of the third order intermodulation components in this example.

For very low amplitudes, the Delta-Sigma PD+PA SFDR curve reaches a limit because the IM3 drops below the noise floor. For extremely high amplitudes, above $v_{i1dB}$, the SFDR improvement diminishes as the PA is close to strong saturation and the predistorter starts to be out of its maximum range.

The graph of FIG. 14 shows that the delta-sigma modulation predistortion technique allows an increase of the linearity for a given input signal level. Alternatively, it shows that delta-sigma modulation allows an increase of the input amplitude (which gives higher power amplifier PA efficiency) for a given linearity.

Having described this invention in connection with a number of embodiments, modification will now certainly suggest itself to those skilled in the art. As such, the invention is not to be limited to the disclosed embodiments except as required by the appended claims.

What is claimed is:

1. An amplifier circuit having and input and an output, the amplifier circuit comprising:
   a) a predistorter comprising a signal input, an output, and a control input;
   b) a power amplifier comprising an input and an output, the power amplifier input being coupled to the output of the predistorter;
   c) a gain error detector comprising a first input coupled to the signal input of the predistorter via a delay circuit, a second input coupled to the power amplifier output, and an output; and
   d) a delta-sigma modulator comprising an input coupled to the gain error detector output, and an output coupled to the control input of the predistorter.

2. The amplifier circuit of claim 1 wherein the predistorter is constructed to provide an output selected from a set of output characteristic curves in response to a control signal at the control input of the predistorter.

3. The amplifier circuit of claim 2 wherein the control input of the predistorter comprises a discrete input.

4. The amplifier circuit of claim 3 wherein the control input of the predistorter comprises a multi-bit binary input.

5. The amplifier circuit of claim 1 wherein the predistorter is constructed to provide an output selected from a set of output characteristic curves in response to a multi-bit binary control signal at the control input.

6. The amplifier circuit of claim 1 wherein the predistorter is an analog predistorter having a multi-bit control input.

7. The amplifier circuit of claim 1 wherein the predistorter comprises an analog signal input, an analog output, and a multi-bit binary control input.

8. The amplifier circuit of claim 1 wherein the predistorter is a digital predistorter, and further comprising a digital-to-analog converter coupled between the digital predistorter and the power amplifier.

9. The amplifier circuit of claim 8 further comprising a digital-to-analog converter coupled between the signal input of the predistorter and the first input of the gain error detector.

10. The amplifier circuit of claim 1 wherein the delta-sigma modulator is adapted to control the predistorter so as to reduce the intermodulation components in the power amplifier output.

11. An amplifier circuit comprising an input and an output, the amplifier circuit comprising:
   a) a predistorter comprising a set of selectable predistortion characteristics, the predistorter being adapted to receive an analog input signal and to provide an analog output signal in accordance with the set of selectable predistortion characteristics;
   b) a power amplifier coupled to receive a predistorted signal from the predistorter;
   c) a gain error detector coupled to the input of the power amplifier circuit via a delay circuit and to the output of the power amplifier circuit so as to be capable of generating a gain error signal; and
   d) a delta-sigma modulator coupled between the predistorter and the gain error detector so as to be capable of modulating the predistorter by providing discrete multi-bit control signals to the predistorter based on the gain error signal for selecting a predistortion characteristic from the set of selectable predistortion characteristics.

12. The amplifier circuit of claim 11 wherein the predistorter is adapted to receive a multi-bit binary control signal from the delta-sigma modulator for controlling the output characteristic of the predistorter.

13. The amplifier circuit of claim 11 wherein the set of predistortion characteristics comprises eight selectable predistortion characteristics.

14. The amplifier circuit of claim 13 wherein the predistorter is adapted to receive a three bit binary control signal from the delta-sigma modulator for controlling the output characteristic of the predistorter.

15. The amplifier circuit of claim 11 wherein the delta-sigma modulator is adapted to control the predistorter so as to reduce the intermodulation components in the output of the amplifier circuit.

16. An amplifier circuit comprising:
   a) a digital predistorter comprising a signal input and an output, the digital predistorter comprises a set of predistortion characteristics;
   b) a power amplifier comprising an input coupled to the output of the predistorter via an analog-to-digital converter, the power amplifier comprising an output;
   c) a gain error detector coupled to the input of the power amplifier circuit via a delay circuit and to the output of the power amplifier circuit so as to be capable of generating a gain error signal; and
   d) a delta-sigma modulator coupled between the gain error detector and the predistorter so as to be capable of modulating the predistorter by supplying a discrete multi-bit error signal to the predistorter for selecting a predistortion characteristic of the predistorter.

17. The amplifier circuit of claim 16 wherein the predistorter comprises a set of eight selectable predistortion characteristics.

18. The amplifier circuit of claim 17 wherein the digital predistorter is adapted to receive a three bit control signal from the delta-sigma modulator for selecting the predistortion characteristic of the digital predistorter.

19. The amplifier circuit of claim 16 wherein the delta-sigma modulator is adapted to control the predistorter so as to reduce the intermodulation components in the power amplifier output.

20. An amplifier circuit having an input and an output, the amplifier circuit comprising:
   a) a phase predistorter comprising a signal input, an output, and a multi-bit control input;
   b) a power amplifier comprising an input and an output, the power amplifier input being coupled to the output of the phase predistorter;
   c) a phase error detector comprising a first input coupled to the power amplifier circuit input, a second input coupled to the power amplifier output, and an output; and
   d) a delta-sigma modulator comprising an input coupled to the phase error detector output, and an output coupled to the multi-bit control input of the phase predistorter.

21. The amplifier circuit of claim 20 further comprising:
   a) a gain predistorter comprising a signal input and an output coupled in series with the phase predistorter, and comprising a control input;
   b) a gain error detector having a first input coupled to the power amplifier circuit input via a delay circuit, a second input coupled to the power amplifier output, and an output; and
   c) a delta-sigma modulator comprising an input coupled to the gain error detector output, and an output coupled to the control input of the gain predistorter.

22. An amplifier circuit having and input and an output, the amplifier circuit comprising:
   a) a predistorter comprising a signal input, an output, and a control input;
   b) a power amplifier comprising an input and an output, the power amplifier input being coupled to the output of the predistorter;
   c) an error detector comprising a first input coupled to the signal input of the predistorter via a delay circuit, a second input coupled to the power amplifier output, and an output; and
   d) a delta-sigma modulator comprising:
      (i) a subtractor comprising a first input coupled to the error detector output, the subtractor comprising a second input and an output;
      (ii) a filter comprising an input and an output, the input of the filter being coupled to the output of the subtractor, wherein the filter comprises one of: (a) an integrator, (b) a higher order low pass filter; or (c) a higher order bandpass filter;
      (iii) an analog-to-digital converter comprising an input and a multi-bit output, the input of the analog-to-digital converter being coupled to the output of the filter and the multi-bit output being coupled to the control input of the predistorter; and
      (iv) a digital-to-analog converter comprising a multi-bit input and an output, the multi-bit input of the digital-to-analog converter being coupled to the multi-bit output of the analog-to-digital converter and the output of the digital-to-analog converter being coupled to the second input of the subtractor.

23. The amplifier circuit of claim 22 wherein the error detector comprises:
   a) a first AC coupler comprising an input and an output, the input of the first AC coupler being coupled to the input of the amplifier linearization circuit;
   b) a first absolute value circuit comprising an input and an output, the input of the first absolute value circuit being coupled to the output of the first AC coupler;
   c) a first low pass filter comprising an input and an output, the input of the first low pass filter being coupled to the output of the first absolute value circuit;
   d) an attenuator comprising an input and an output, the input of the attenuator being coupled to the output of the amplifier linearization circuit,
   e) a second AC coupler comprising an input and an output, the input of the second AC coupler being coupled to the output of the attenuator;
   f) a second absolute value circuit comprising an input and an output, the input of the second absolute value circuit being coupled to the output of the second AC coupler;
   g) a second low pass filter comprising an input and an output, the input of the second low pass filter being coupled to the output of the second absolute value circuit; and
   h) a subtractor comprising:
      (i) a first input coupled to the output of the first low pass filter;
      (ii) a second input coupled to the output of the second low pass filter; and
      (iii) an output coupled to the input of the delta-sigma modulator.

24. A method for amplifier linearization, the method comprising:
   a) producing a predistorted signal from an input signal using a predistorter;
   b) amplifying the predistorted signal to provide an amplifier output signal;
   c) comparing the input signal and the output signal;
   d) generating an error signal; and
   e) generating control signals based on the error signal using a delta-sigma modulator;

f) supplying the control signals from the delta-sigma modulator to the predistorter to modulate the predistorter.

25. The method of claim 24 wherein generating the control signals comprises generating a discrete multi-bit signal in response the error signal.

26. The method of claim 25 wherein supplying the control signal comprises supplying a binary signal to the predistorter.

27. The method of claim 26 wherein supplying the control signal comprises supplying a three bit binary signal to the predistorter.

28. The method of claim 25 wherein supplying the control signal comprises supplying a three bit discrete signal to the predistorter.

29. The method of claim 24 wherein producing the predistorted signal from the input signal comprises producing a predistorted signal from an input signal comprising at least two frequencies, and wherein generating control signals and supplying the control signals to the predistorter comprises generating control signals and supplying the control signals so as to reduce intermodulation components in the amplifier output signal.

30. The method of claim 24 wherein producing the predistorted signal comprises selecting a predistortion characteristic from a set of predistorter characteristics.

31. The method of claim 30 wherein selecting a predistortion characteristic comprises selecting from a set of eight predistorter characteristics.

32. The method of claim 24 wherein producing the predistorted signal comprises producing a digital predistorted signal, and wherein generating the error signal comprises generating a gain error signal.

33. The method of claim 32 further comprising supplying the digital predistorted signal to an digital-to-analog converter prior to amplifying.

34. The method of claim 24 wherein producing the predistorted signal comprises producing a phase predistorted signal, and wherein generating the error signal comprises generating a phase error signal.

35. The method of claim 24 wherein producing the predistorted signal comprises producing an analog predistorted signal, and wherein generating the error signal comprises generating a gain error signal.

* * * * *